(12) United States Patent
Huang et al.

(10) Patent No.: US 7,981,729 B2
(45) Date of Patent: Jul. 19, 2011

(54) FABRICATION METHOD OF MULTI-CHIP STACK STRUCTURE

(75) Inventors: Jung-Pin Huang, Taichung (TW); Chin-Huang Chang, Taichung (TW); Chien-Ping Huang, Taichung (TW); Chung-Lun Liu, Taichung (TW); Cheng-Hsu Hsiao, Taichung (TW)

(73) Assignee: Siliconware Precision Industries Co., Ltd., Taichung (TW)

( * ) Notice: Subject to any disclaimer, the term of this patent is extended or adjusted under 35 U.S.C. 154(b) by 0 days.

(21) Appl. No.: 12/818,701

(22) Filed: Jun. 18, 2010

(65) Prior Publication Data

US 2010/0255635 A1    Oct. 7, 2010

Related U.S. Application Data

(62) Division of application No. 12/077,003, filed on Mar. 13, 2008, now Pat. No. 7,768,106.

(30) Foreign Application Priority Data

Mar. 13, 2007    (TW) ............................ 96108504 A

(51) Int. Cl.
*H01L 21/60* (2006.01)

(52) U.S. Cl. ........ 438/123; 438/107; 438/118; 438/124; 257/E21.509

(58) Field of Classification Search .................. 257/675, 257/674, 777, 738, 782, 673, 737, E23.021, 257/E23.035, E21.509; 438/118, 119, 123, 438/124, 206, 209, 617, 613, FOR. 366, FOR. 367
See application file for complete search history.

(56) References Cited

U.S. PATENT DOCUMENTS

| | | | |
|---|---|---|---|
| 5,545,922 | A | 8/1996 | Golwalkar et al. |
| 2007/0026573 | A1 | 2/2007 | Ismail et al. |
| 2008/0023831 | A1* | 1/2008 | Nishimura et al. ........... 257/737 |

* cited by examiner

*Primary Examiner* — Victor Mandala
*Assistant Examiner* — Whitney Moore
(74) *Attorney, Agent, or Firm* — Peter F. Corless; Steven M. Jensen; Edwards Angell Palmer & Dodge LLP

(57) ABSTRACT

A multi-chip stack structure and a fabrication method thereof are proposed, including providing a leadframe having a die base and a plurality of leads and disposing a first and a second chips on the two surfaces of the die base respectively; disposing the leadframe on a heating block having a cavity in a wire bonding process with the second chip received in the cavity of the heating block; performing a first wire bonding process to electrically connect the first chip to the leads through a plurality of first bonding wires, and forming a bump on one side of the leads connected with the first bonding wires; disposing the leadframe in an upside down manner to the heating block via the bump with the first chip and the first bonding wires received in the cavity of the heating block; and performing a second wire bonding process to electrically connect the second chip to the leads through a plurality of second bonding wires. The bump is used for supporting the leads to a certain height so as to keep the bonding wires from contacting the heating block and eliminate the need of using a second heating block in the second wire bonding process of the prior art, thereby saving time and costs in a fabrication process. Also, as positions where the first and second bonding wires are bonded to the leads on opposite sides of the leadframe correspond with each other, the conventional problems of adversely affected electrical performance and electrical mismatch can be prevented.

16 Claims, 6 Drawing Sheets

FABRICATION METHOD OF MULTI-CHIP STACK STRUCTURE

CROSS-REFERENCE TO RELATED APPLICATION(S)

This application is a divisional of application U.S. Ser. No. 12/077,003, filed on Mar. 13, 2008.

BACKGROUND OF THE INVENTION

1. Field of the Invention

The present invention relates generally to a multi-chip stack structure and fabrication method thereof, and more particularly to a leadframe-type multi-chip stack structure and fabrication method thereof.

2. Description of Related Art

Currently, multi-chip module (MCM) semiconductor packages with improved performance and capacity have been developed for meeting demand for high integration and miniaturization of packages, thereby facilitating fabrication of portable and multifunctional electronic products with high performance. Typically, a multi-chip module semiconductor package comprises at least two chips stack disposed to a chip carrier.

FIGS. 1A to 1D show a fabrication method of a leadframe-type multi-chip stack structure disclosed by U.S. Pat. No. 5,545,922. First, as shown in FIG. 1A, a leadframe 10 having a die base 101 and a plurality of leads 102 disposed around the die base 101 is provided, and a first chip 11 is disposed to a first surface of the die base 101 through a die bonding process. Subsequently, as shown in FIG. 1B, the leadframe 10 is upside-down disposed to a support block 13 having a cavity 130, wherein the leads 102 are supported by the support block 13 and the first chip 11 is received in the cavity 130, and a second chip 12 is further disposed to a second surface of the die base 101. Then, the leadframe 10 mounted with the first and second chips 11, 12 is disposed on a first heating block 15 having a first cavity 150 with the leads 102 pressed by clamping blocks 14 and the second chip 12 received in the first cavity 150. Thereafter, a first wire bonding process is performed so as to form a plurality of first bonding wires 161 electrically connecting the first chip 11 to the leads 102, wherein stitch bonds are formed at positions where the first bonding wires 161 are bonded the leads 102. Further, the stitch bonds are supported by the heating block 15 such that sufficient heat can be provided by the first heating block 15 for efficiently bonding the first bonding wires 161 and the leads 102, as shown in FIG. 1C. Then, the leadframe 10 is upside-down disposed to a second heating block 17 with the leads 102 supported by the second heating block 17, and a second wire bonding process is performed so as to form a plurality of second bonding wires 162 electrically connecting the second chip 12 and the leads 102, wherein the first chip 11 and the first bonding wires 161 are received in a second cavity 170 of the second heating block 17. Similarly, stitch bonds of the second bonding wires 162 bonding the leads 102 are supported by the second heating block 17 such that sufficient heat can be provided by the second heating block 17 for efficiently bonding the first bonding wires 161 and the leads 102. Meanwhile, the stitch bonds of the second bonding wires 162 offset from the stitch bonds of the first bonding wires 161, as shown in FIG. 1D.

In the above-mentioned multi-chip stack structure, two heating blocks are needed and the wire bonding positions need to be changed on opposite sides of the leadframe, which not only increases the fabrication time but also increases the fabrication expense. Further, as bonding position of the second bonding wires on the leadframe need to be offset outward corresponding to the second heating block, the length of the bonding wires is increased, thereby adversely affecting the electrical performance of the whole structure and meanwhile increasing the whole package size. Furthermore, the first and second chips may not match due to electrical function difference therebetween.

Therefore, how to overcome the above drawbacks has become urgent.

SUMMARY OF THE INVENTION

According to the above drawbacks, an objective of the present invention is to provide a multi-chip stack structure and fabrication method thereof so as to efficiently stack a plurality of semiconductor chips on a leadframe and electrically couple the semiconductor chips.

Another objective of the present invention is to provide a multi-chip stack structure and fabrication method thereof, which eliminates the need of two heating blocks and changing positions so as to save fabrication time and expense.

A further objective of the present invention is to provide a multi-chip stack structure and fabrication method thereof, which eliminates the need of offsetting outward the second bonding wires, thereby preventing such problems as adversely affected electrical performance, increased structure size and electrical mismatch between the first chip and the second chip.

In order to attain the above and other objectives, the present invention discloses a fabrication method of a multi-chip stack structure, comprising: providing a leadframe having a die base and a plurality of leads, a first chip and a second chip being disposed to two opposite surfaces of the die base respectively; disposing the leadframe on a heating block having a cavity, the leads being supported by the heating block and the second chip being received in the cavity; performing a first wire bonding process so as to form a plurality of first bonding wires electrically connecting the first chip and the leads, and meanwhile disposing at least a bump at one side of the leads connected with the first bonding wires; disposing the leadframe upside-down on the heating block through the bump, the first chip and the first bonding wires being received in the cavity; and performing a second wire bonding process so as to form a plurality of second bonding wires electrically connecting the second chip and the leads.

A bonding area is disposed in an inner end of each lead for disposing of the bonding wires. The height of the bump is bigger than that of the bonding wires in the bonding area of the leads such that the bonding wires can be prevented from contacting the heating block when the leadframe is disposed on the heating block through the bump. By melting a gold wire into a ball shape through tip of a wire bonder, at least a gold stud is formed on the leads, wherein the gold stud is close to stitch bond of the bonding wires or directly disposed on the stitch bond of the bonding wires. In addition, a plurality of bumps can be stack disposed.

According to another embodiment of the present invention, the fabrication method of a multi-chip stack structure comprises: providing a leadframe having a die base and a plurality of leads, wherein, a first chip is disposed to a surface of the die base and a first wire bonding process is performed so as to form a plurality of first bonding wires electrically connecting the first chip and the leads, and meanwhile disposing at least a bump at one side of the leads connected with the first bonding wires; disposing the leadframe upside-down on a heating block having a cavity, the first chip and the first bonding wires being received in the cavity; and disposing a second chip on another surface of the die base and performing a second wire bonding process so as to form a plurality of second bonding wires electrically connecting the second chip and the leads.

Through the above-mentioned fabrication method, the present invention further discloses a multi-chip stack structure, which comprises: a leadframe having a die base and a plurality of leads, a bonding area being disposed in an inner end of the leads; a plurality of chips disposed on two opposite surfaces of the die base respectively; a plurality of bonding wires electrically connecting the chips and the bonding area of the leads; and at least a bump formed in the bonding area of the leads, height of the bump being bigger than that of the bonding wires in the bonding area.

According to the present invention, at least one bump is disposed on the leads of the leadframe such that the leadframe can be disposed on the heating block through the bump for supporting the leads at a certain height and preventing the heating block from contacting the bonding wires. In addition, the present invention eliminates the need of changing disposing position of the heating block and the need of a second heating block, thereby saving the fabrication time and cost. Further, heat provided by the heating block can be transferred to the leads through the bump and accordingly the second bonding wires can be bonded with the leads at a position corresponding to the position where the first bonding wires are bonded with the leads, through which the structure size can be efficiently controlled and meanwhile the first and second bonding wires can be kept the same length. As a result, the conventional problems such as adversely affected electrical performance and electrical mismatch are overcome.

DETAILED DESCRIPTION OF PREFERRED EMBODIMENTS

The following illustrative embodiments are provided to illustrate the disclosure of the present invention, these and other advantages and effects can be apparent to those skilled in the art after reading the disclosure of this specification. The present invention can also be performed or applied by other different embodiments. The details of the specification may be on the basis of different points and applications, and numerous modifications and variations can be made without departing from the spirit of the present invention.

First Embodiment

FIGS. 2A to 2E are diagrams showing a fabrication method of a multi-chip stack structure according to a first embodiment of the present invention.

Figure 1A:
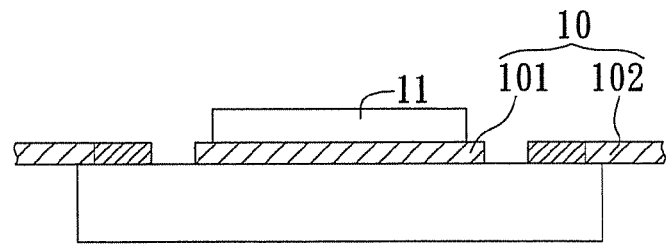
FIGS. 1A to 1D are sectional diagrams showing a fabrication method of a multi-chip stack structure according to U.S. Pat. No. 5,545,922.
Figure 1B:
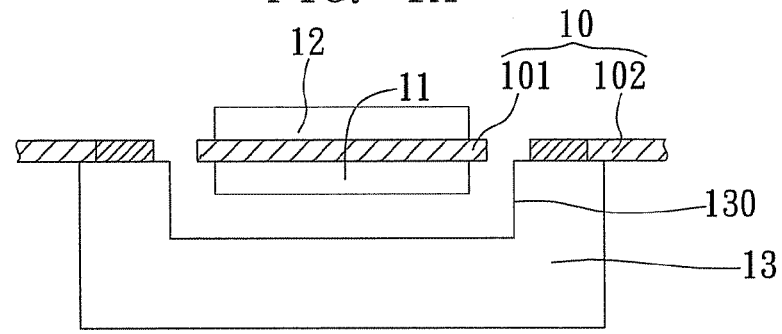
Figure 1C:
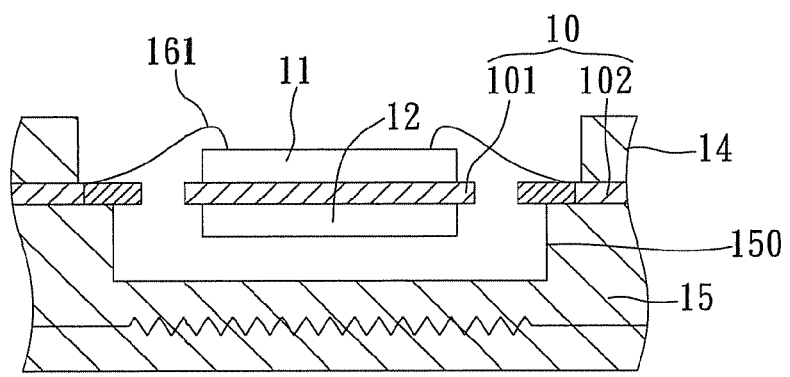
Figure 1D:
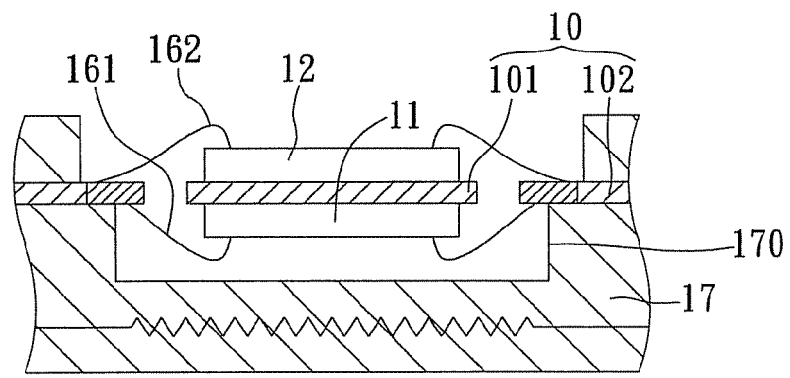
Figure 2A:
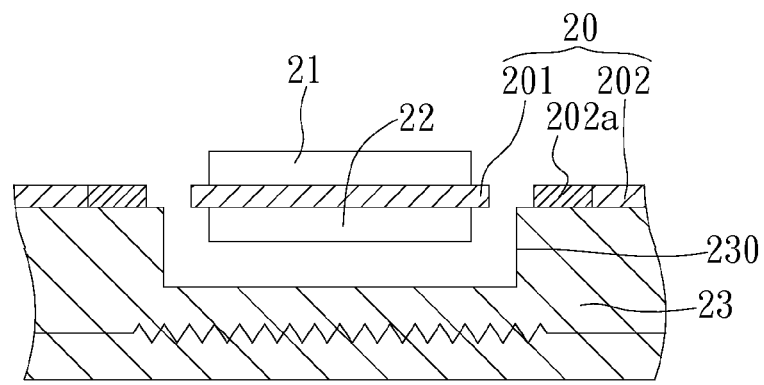
FIGS. 2A to 2E are diagrams showing a multi-chip stack structure and fabrication method thereof according to a first embodiment of the present invention.

As shown in FIG. 2A, a leadframe 20 having a die base 201 and a plurality of leads 202 is provided. The die base 201 has a first surface and a second surface opposed to the first surface, a first chip 21 is disposed to the first surface and a second chip 22 is disposed to the second surface. To perform a wire bonding process, the leadframe 20 is disposed on a heating block 23 having a cavity 230, wherein the leads 202 are supported by the heating block 23 and the second chip 22 is received in the cavity 230.

Figure 2B:
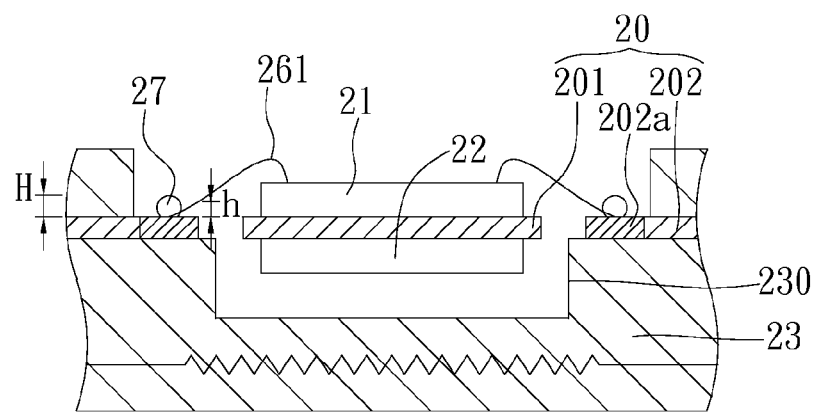
Figure 2C:
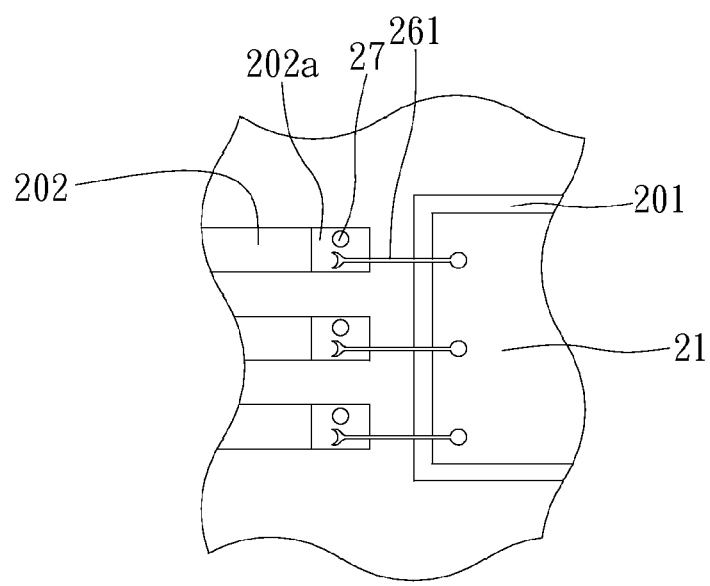

As shown in FIG. 2B and FIG. 2C which is a partial upper view of FIG. 2B, the first wire bonding process is performed so as to form a plurality of first bonding wires 261 electrically connecting the first chip 21 and bonding area 202a of the leads 202. The bonding area 202a is disposed in an inner end of each lead 202. Meanwhile, at least one bump 27 is disposed at one side of the leads 202 connected with the first bonding wires 261. In practice, the bump 27 can be formed in the bonding area 202a after the first wire bonding process is performed and the first bonding wires 261 electrically connect the first chip 21 and the bonding area 202a of the leads 202.

The first bonding wires 261 are gold wires. To bond a wire from the first chip 21 to a lead 202, a ball bond is first formed on the first chip 21 through tip of a wire bonder (not shown), then the tip is moved to the bonding area 202a of the lead 202, and subsequently the first bonding wire 261 is cut so as to form a stitch bond.

By melting a gold wire into a ball shape through tip of a wire bonder, at least a gold stud is formed in the bonding area 202a of the leads 202 and close to the stitch bond of the first bonding wires 261, for example, the gold stud can be positioned at one side of the stitch bond of the first bonding wires 261. The bump 27 can also be predisposed at a predefined position of the leads 202 of the leadframe 20. The bump 27 of gold stud can also be replaced by other metallic bump or conductive bump.

Figure 2D:
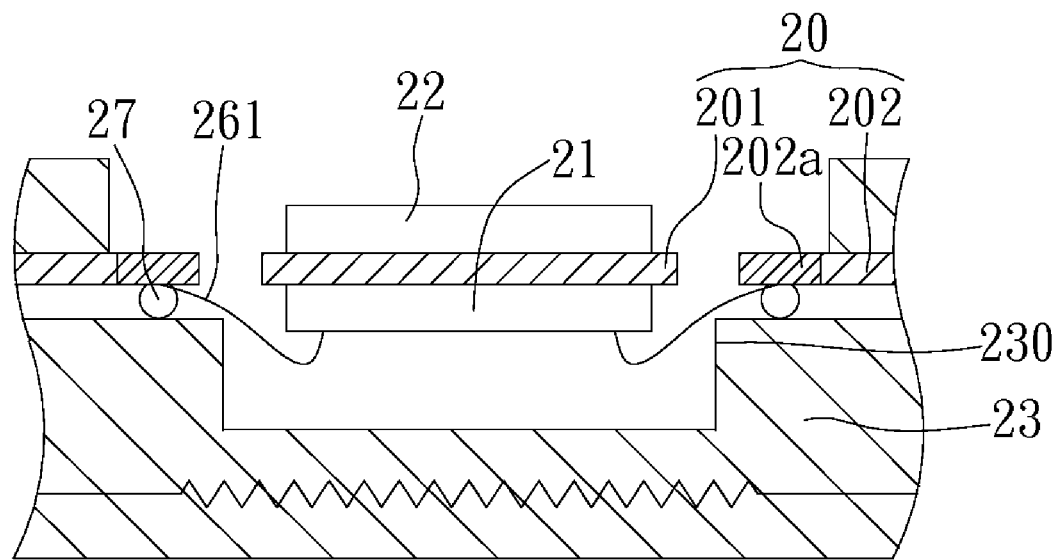

As shown in FIG. 2D, the leadframe 20 is upside-down disposed on the heating block 23 through the bump 27 with the first chip 21 and the first bonding wires 261 received in the cavity 230. The height H of the bump 27 is bigger than height h of the first bonding wires 261 in the bonding area 202a so as to prevent the first bonding wires 261 from contacting the heating block 23 when the leadframe 20 is disposed on the heating block 23 through the bump 27.

Figure 2E:
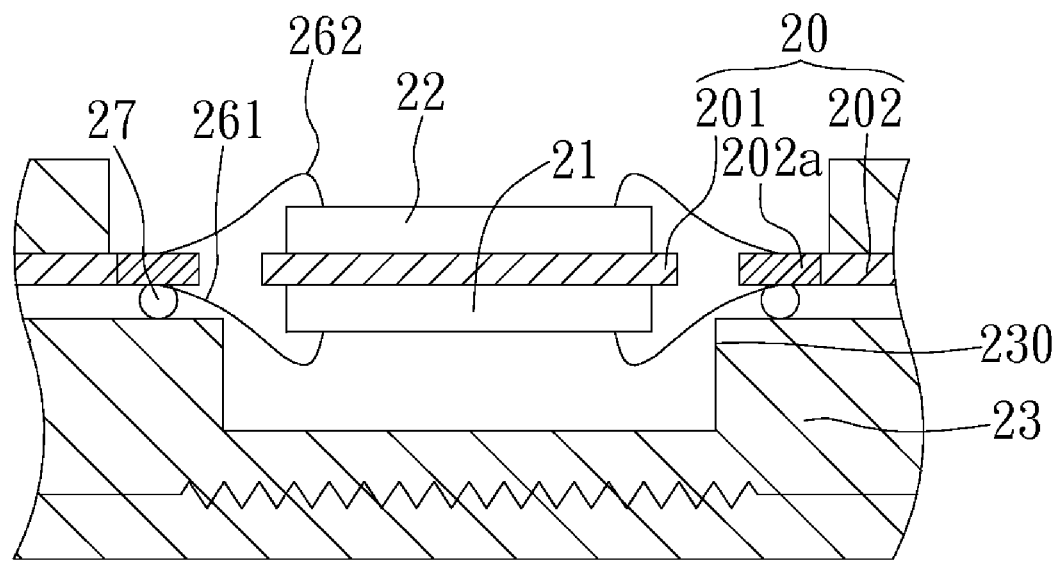

As shown in FIG. 2E, a second wire bonding process is performed so as to form a plurality of second bonding wires 262 electrically connecting the second chip 22 and the leads 202.

In the second wire bonding process, as the leadframe 20 is disposed on the heating block 23 through the bump 27, heat from the heating block 23 can be transferred to the leads 202 through the bump 27. As a result, the second bonding wires 262 bonded with the lead 202 do not need to offset in relation to the first bonding wires 261 bonded with the leads 202. Instead, the second bonding wires 262 can be bonded with the leads 202 at a position corresponding to the position where the first bonding wires 261 are bonded with the leads 202.

Through the above fabrication method, the present invention further discloses a multi-chip stack structure, comprising: a leadframe 20 having a die base 201 and a plurality of leads 202, a bonding area 202a being disposed in an inner end of the leads 202; a plurality of chips comprising a first chip 21 and a second chip 22 respectively disposed on two opposite surfaces of the die base 201; first and second bonding wires 261, 262 electrically connecting the first and second chips 21, 22 and the bonding area 202a of the leads 202; and at least a bump 27 formed on surface of the leads 202, height of the bump 27 being bigger than height of the bonding wires in the bonding area 202a.

Since stitch bonds of the first and second bonding wires 261,262 on opposite surfaces of the die base 201 are located at positions corresponding to each other, the whole structure size can be efficiently controlled. Meanwhile, the first and second bonding wires 261,262 on opposite surfaces are approximately of same length, which can overcome the conventional problems of adversely affected electrical performance and electrical mismatch.

Second Embodiment

Figure 3A:
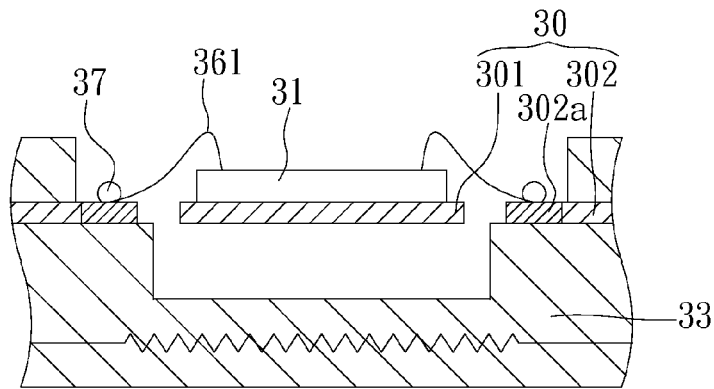
FIG. 3A to 3C are diagrams showing a fabrication method of a multi-chip stack structure according to a second embodiment of the present invention.
Figure 3B:
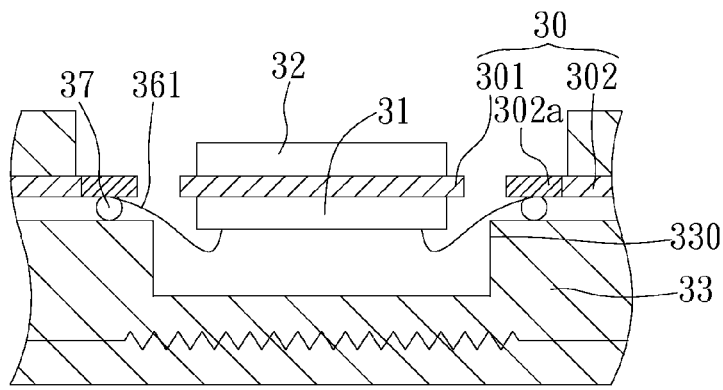
Figure 3C:
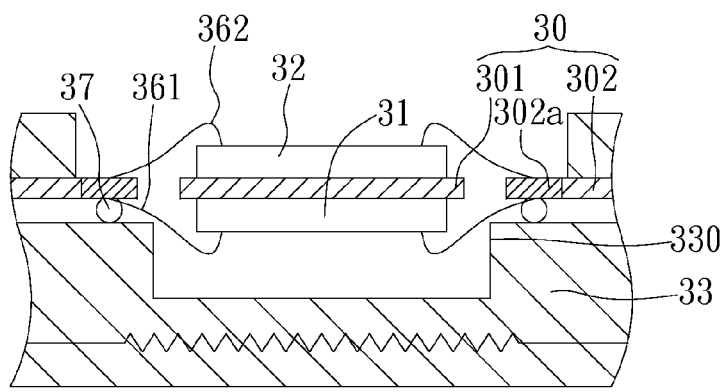
Figure 4A:
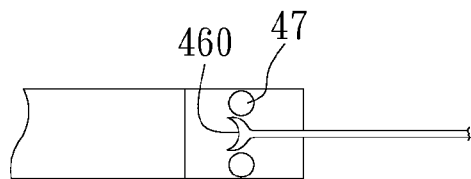
FIGS. 4A to 4E are diagrams showing different embodiments of a bonding area of the leads with bumps disposed at different positions relative to the stitch bond.
Figure 4B:
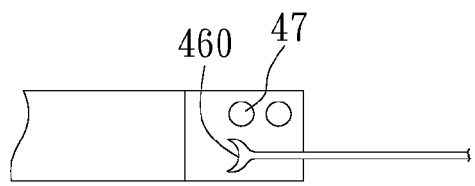
Figure 4C:
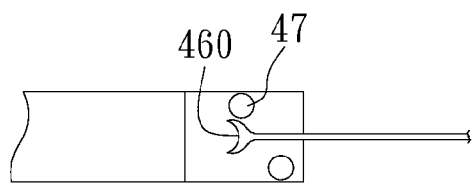
Figure 4D:
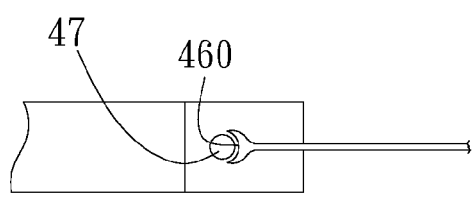
Figure 4E:
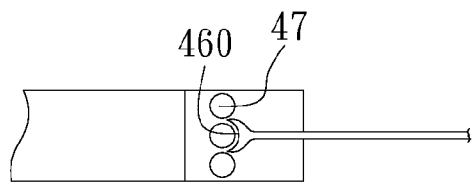

FIGS. 3A to 3C are sectional diagrams showing a fabrication method of a multi-chip stack structure according to a second embodiment of the present invention.

As shown in FIG. 3A, a leadframe 30 having a die base 301 and a plurality of leads 302 is provided. A first chip 31 is disposed to a surface of the die base 301 and a wire bonding process is performed so as to form a plurality of first bonding wires 361 electrically connecting the first chip 31 and bonding area 302a of the leads 302. Meanwhile, at least one bump 37 is disposed at one side of the leads 302 connected with the first bonding wires 361.

Therein, the leadframe 30 is disposed on a heating block 33 through the leads 302.

As shown in FIG. 3B, the leadframe 30 is upside-down disposed on the heating block 33 through the bump 37, wherein the first chip 31 and the first bonding wires 361 are received in the cavity 330 of the heating block 33.

As shown in FIG. 3C, a second chip 32 is disposed to another surface of the die base 301 and a second wire bonding process is performed so as to form a plurality of second bonding wires 362 electrically connecting the second chip 32 and the leads 302.

FIGS. 4A to 4E are diagrams of the bonding area of the leads where bonding wire is bonded and bump is formed. As shown in FIGS. 4A to 4E, one or a plurality of bumps 47 can be provided, which can be disposed symmetrically at two opposite sides of the stitch bond 460, or disposed at one side of the stitch bond 460, or disposed staggeringly at two sides of the stitch bond 460, or disposed at top of the stitch bond 460.

Figure 5:
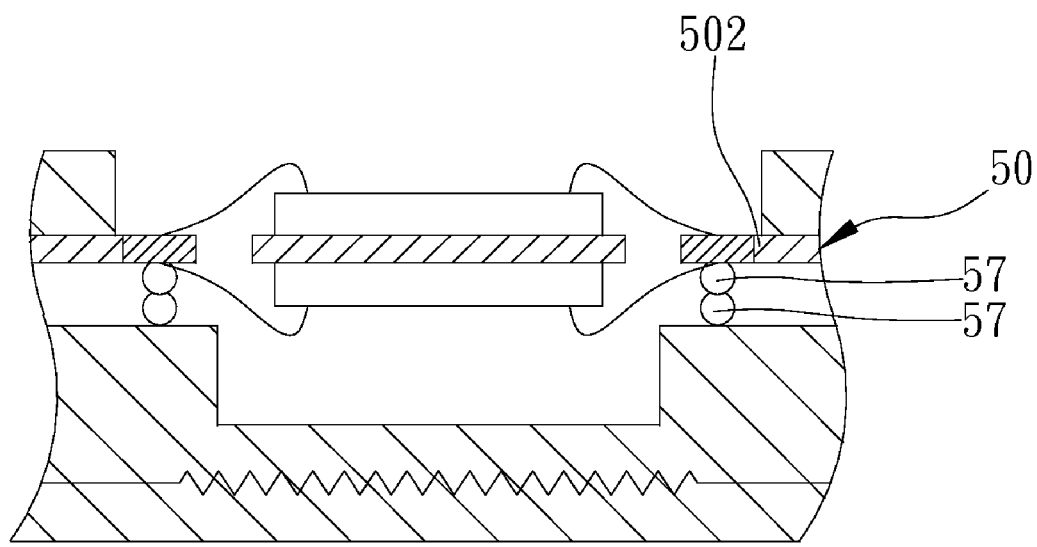
FIG. 5 is a diagram showing a multi-chip stack structure according to another embodiment of the present invention.

Further referring to FIG. 5, another embodiment of the multi-chip stack structure is shown. The main difference of the present embodiment from the above-mentioned embodiments is a plurality of bumps 57 are stacked on the leads 502 so as to support the leadframe 50 at a much bigger height for further preventing the bonding wires from contacting the heating block.

Moreover, the bump that is disposed on the leads can alternatively be directly disposed on the stitch bond formed in the first wire bonding process so as to increase the support height of the leadframe for further preventing the bonding wires from contacting the heating block and facilitating the stitch bond formed in the second wire bonding process to be disposed at a position corresponding to the stitch bond formed in the first wire bonding process.

According to the present invention, at least one bump is disposed on the leads of the leadframe such that the leadframe can be disposed on the heating block through the bump, thereby supporting the leads to a certain height and preventing the heating block from contacting the bonding wires. The present invention also eliminates the need of changing disposing position of the heating block and the need of a second heating block, thereby saving the fabrication time and cost. Further, heat provided by the heating block can be transferred to the leads through the bump and accordingly the second bonding wires can be bonded with the leads at a position corresponding to the position where the first bonding wires are bonded with the leads, through which the structure size can be efficiently controlled and meanwhile the first and second bonding wires can be kept the same length. As a result, the conventional problems such as adversely affected electrical performance and electrical mismatch are overcome.

The above-described descriptions of the detailed embodiments are only to illustrate the preferred implementation according to the present invention, and it is not to limit the scope of the present invention, Accordingly, all modifications and variations completed by those with ordinary skill in the art should fall within the scope of present invention defined by the appended claims.

What is claimed is:

1. A fabrication method of a multi-chip stack structure, comprising:
   providing a leadframe having a die base and a plurality of leads, a first chip and a second chip being disposed to two opposite surfaces of the die base respectively, wherein a bonding area is formed on an inner end of each of the leads;
   disposing the leadframe on a heating block having a cavity, the leads being supported by the heating block and the second chip being received in the cavity;
   performing a first wire bonding process so as to form a plurality of first bonding wires electrically connecting the first chip and the leads with a stitch bond of each of the first bonding wires located in the bonding area of each of the leads, and meanwhile disposing at least a bump at one side of the leads connected with the first bonding wires, wherein the bump is formed in the bonding area of each of the leads and is close to the stitch bond of each of the first bonding wires;
   disposing the leadframe upside-down on the heating block through the bump, the first chip and the first bonding wires being received in the cavity; and
   performing a second wire bonding process so as to form a plurality of second bonding wires electrically connecting the second chip and the leads.

2. The fabrication method of claim 1, wherein the bonding area is formed for disposing of the first bonding wires, the second bonding wires and the bump.

3. The fabrication method of claim 2, wherein the height of the bump is bigger than that of the first bonding wires in the bonding area of the leads.

4. The fabrication method of claim 1, wherein the second bonding wires are bonded with the leads at a position corresponding to the position where the first bonding wires are bonded with the leads.

5. The fabrication method of claim 1, wherein by melting a gold wire into a ball shape through a tip of a wire bonder, at least a gold stud is formed on the leads, wherein the gold stud is close to the stitch bond of each of the bonding wires or directly disposed on the stitch bond of each of the bonding wires.

6. The fabrication method of claim 1, wherein at least a bump is disposed on top of the stitch bonds of the bonding wires, or disposed symmetrically at two sides of the stitch bonds of the bonding wires, or disposed at one side of the stitch bonds of the bonding wires, or disposed staggeringly at two sides of the stitch bonds of the bonding wires.

7. The fabrication method of claim 1, wherein a plurality of bumps are stacked.

8. The fabrication method of claim 1, wherein the first and second bonding wires are of same length.

9. A fabrication method of a multi-chip stack structure, comprising:

provided a leadframe having a die base and a plurality of leads, with a first chip disposed to a surface of the die base and a first wire bonding process is performed so as to form a plurality of first bonding wires electrically connecting the first chip and the leads, and meanwhile disposing at least a bump at one side of the leads connected with the first bonding wires, wherein a bonding area is formed on an inner end of each of the leads, a stitch bond of each of the first bonding wires is located in the bonding area of each of the leads, and the bump is formed in the bonding area of each of the leads and is close to the stitch bond of each of the first bonding wires;

disposing the leadframe upside-down on a heating block having a cavity, the first chip and the first bonding wires being received in the cavity; and disposing a second chip on another surface of the die base and performing a second wire bonding process so as to form a plurality of second bonding wires electrically connecting the second chip and the leads.

10. The fabrication method of claim 9, wherein the bonding area is formed for disposing of the first bonding wires, the second bonding wires and the bump.

11. The fabrication method of claim 9, wherein the height of the bump is bigger than that of the first bonding wires in the bonding area of the leads.

12. The fabrication method of claim 11, wherein the first and second bonding wires are of same length.

13. The fabrication method of claim 9, wherein the second bonding wires are bonded with the leads at a position corresponding to the position where the first bonding wires are bonded with the leads.

14. The fabrication method of claim 9, wherein by melting a gold wire into a ball shape through a tip of a wire bonder, at least a gold stud is formed on the leads, wherein the gold stud is close to the stitch bond of each of the bonding wires or directly disposed on the stitch bond of each of the bonding wires.

15. The fabrication method of claim 9, wherein at least a bump is disposed on top of the stitch bonds of the bonding wires, or disposed symmetrically at two sides of the stitch bonds of the bonding wires, or disposed at one side of the stitch bonds of the bonding wires, or disposed staggeringly at two sides of the stitch bonds of the bonding wires.

16. The fabrication method of claim 9, wherein a plurality of bumps are stacked.

* * * * *